(12) United States Patent
Chan et al.

(10) Patent No.: US 10,501,312 B2
(45) Date of Patent: Dec. 10, 2019

(54) OVER-UNDER SENSOR PACKAGING WITH SENSOR SPACED APART FROM CONTROL CHIP

(71) Applicant: Infineon Technologies AG, Neubiberg (DE)

(72) Inventors: Sook Woon Chan, Melaka (MY); Chau Fatt Chiang, Melaka (MY); Kok Yau Chua, Melaka (MY); Swee Kah Lee, Melaka (MY); Chee Yang Ng, Muar (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/653,234

(22) Filed: Jul. 18, 2017

(65) Prior Publication Data

US 2019/0023561 A1  Jan. 24, 2019

(51) Int. Cl.
| | |
|---|---|
| *B81B 7/00* | (2006.01) |
| *H01L 29/84* | (2006.01) |
| *H04R 1/04* | (2006.01) |
| *B81B 7/02* | (2006.01) |
| *B81C 1/00* | (2006.01) |

(Continued)

(52) U.S. Cl.
CPC .......... *B81B 7/0064* (2013.01); *B81B 7/0035* (2013.01); *B81B 7/0058* (2013.01); *B81B 7/02* (2013.01); *B81C 1/00269* (2013.01); *G01L 19/0084* (2013.01); *H01L 29/84* (2013.01); *H04R 19/005* (2013.01); *H04R 19/04* (2013.01); *H04R 31/00* (2013.01); *H04R 1/04* (2013.01); *H04R 1/086* (2013.01)

(58) Field of Classification Search
CPC ... B81B 7/0064; B81B 7/0035; B81B 7/0058; B81B 7/02; B81B 2207/012–017; B81B 2201/0264; B81B 2201/0257–0264; B81B 2203/0127; B81B 2203/0315; B81B 3/0018–0032; B81B 7/007–008; B81B 2207/01; B81C 1/00269; G01L 19/0084; H04R 1/04; H04R 2201/029; H04R 19/016; H04R 19/04; H04R 31/00; Y10T 29/49005; B33Y 80/00; H01L 29/84; H01L 2924/1461
USPC .................................................. 257/414–422
See application file for complete search history.

(56) References Cited

U.S. PATENT DOCUMENTS

2012/0153771 A1* 6/2012 Formosa ............... B81C 1/0023
310/300
2012/0308045 A1  12/2012 Minoo et al.
(Continued)

*Primary Examiner* — Nelson Garces
(74) *Attorney, Agent, or Firm* — Slater Matsil, LLP

(57) ABSTRACT

An embodiment device includes a body structure having an interior cavity, a control chip disposed on a first interior surface of the interior cavity, and a sensor attached, at a first side, to a second interior surface of the interior cavity opposite the first interior surface. The sensor has a mounting pad on a second side of the sensor that faces the first interior surface, and the sensor is vertically spaced apart from the control chip by an air gap, with the sensor is aligned at least partially over the control chip. The device further includes an interconnect having a first end mounted on the mounting pad, the interconnect extending through the interior cavity toward the first interior surface, and the control chip is in electrical communication with the sensor by way of the interconnect.

20 Claims, 10 Drawing Sheets

(51) Int. Cl.
*G01L 19/00* (2006.01)
*H04R 19/00* (2006.01)
*H04R 19/04* (2006.01)
*H04R 31/00* (2006.01)
*H04R 1/08* (2006.01)

(56) References Cited

U.S. PATENT DOCUMENTS

| | | |
|---|---|---|
| 2012/0321111 A1* | 12/2012 | Lillelund ................ H04R 1/04 381/174 |
| 2013/0195284 A1 | 8/2013 | Yang et al. |
| 2014/0045290 A1* | 2/2014 | Horimoto ............ H04R 19/005 438/51 |
| 2014/0361387 A1 | 12/2014 | Meyer et al. |
| 2015/0253169 A1* | 9/2015 | Najafi ...................... G01F 1/69 73/204.14 |
| 2015/0256917 A1* | 9/2015 | Schelling ................ H04R 1/08 381/111 |
| 2016/0214857 A1 | 7/2016 | Lin et al. |
| 2017/0164107 A1 | 6/2017 | Murgia et al. |

* cited by examiner

OVER-UNDER SENSOR PACKAGING WITH SENSOR SPACED APART FROM CONTROL CHIP

TECHNICAL FIELD

The present invention relates generally to a system and method for an over-under sensor package, and, in particular embodiments, to a system and method for packaging a sensor and associated control chip in a vertical arrangement with the sensor spaced apart from the control chip in a shielded enclosure.

BACKGROUND

Generally, microelectrical mechanical system (MEMS) sensor devices operate on physically sensible environmental conditions. For example, MEMS devices may sense sound, air pressure, motion, or the like. MEMS devices are generally simple sensor devices that generate a raw electrical signal. MEMS sensors, such as MEMS microphones, have a movable membrane that reacts to pressure waves in air in an interior cavity of the MEMS microphone to generate the electrical signal. A MEMS device package frequently includes a control chip, such as an application specific integrated circuit (ASIC), to manage the MEMS sensor device, read the raw data signal from the MEMS sensor device, and convert the data signal into a desired data format. In some sensor device packages, the MEMS sensor device and the control chip are disposed in a cavity of the sensor device package.

SUMMARY

An embodiment device includes a body structure having an interior cavity, a control chip disposed on a first interior surface of the interior cavity, and a sensor attached, at a first side, to a second interior surface of the interior cavity opposite the first interior surface. The sensor has a mounting pad on a second side of the sensor that faces the first interior surface, and the sensor is vertically spaced apart from the control chip by an air gap, with the sensor is aligned at least partially over the control chip. The device further includes an interconnect having a first end mounted on the mounting pad, the interconnect extending through the interior cavity toward the first interior surface, and the control chip is in electrical communication with the sensor by way of the interconnect.

An embodiment device includes a substrate having a first contact pad, a sidewall, and a lid attached to the substrate by the sidewall, where the lid is separated from the substrate by an interior cavity that is bounded by the sidewall, the lid and the substrate. The device further includes a control chip disposed on the substrate and extending from the substrate into the interior cavity, with the control chip in electrical communication with the first contact pad. A sensor is attached, at a first side, to the lid, with the sensor extending from the lid into the interior cavity, and with the sensor having a mounting pad. The sensor is vertically spaced apart from the control chip by an air gap, and wherein the sensor is aligned at least partially over the control chip. The device further has an interconnect having a first end mounted on the mounting pad, with the interconnect extending through the interior cavity and making electrical contact, at a second end of the interconnect opposite the first end, with the first contact pad, where the interconnect is spaced apart from the sidewall.

An embodiment method includes attaching a first side of a sensor to a first side of a lid, with the sensor having a contact pad disposed on a second side of the sensor opposite the first side, providing an interconnect on the contact pad, where a first end of the interconnect is attached to the contact pad, and wherein the interconnect extends away from the contact pad, attaching a control chip to a first side of a substrate and electrically connecting the control chip to a landing pad disposed at the first side of the substrate, and affixing the lid over the substrate, wherein the affixing forms an interior cavity between the lid and the substrate. After the affixing, the sensor and the control chip each extend into the interior cavity and an air gap is provided between the sensor and the control chip, and, after the affixing, the interconnect extends through the interior cavity, and a second end of the interconnect makes electrical contact with the landing pad.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
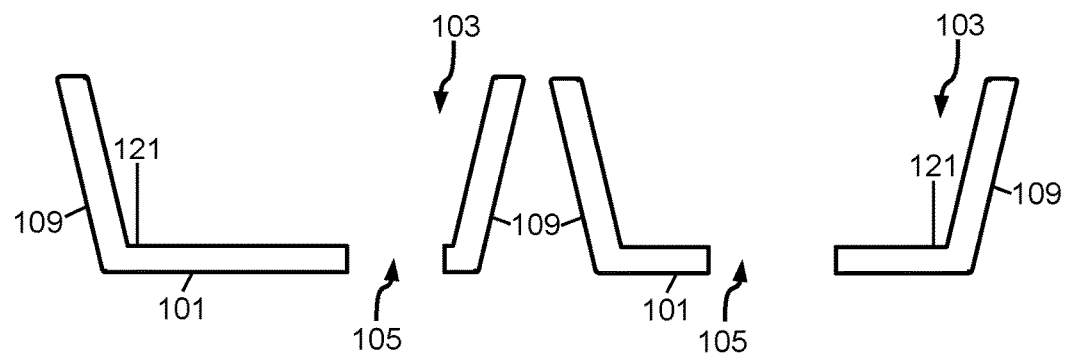
FIGS. 1A-1C illustrate formation of a first portion of a sensor package according to some embodiments.

Illustrative embodiments of the system and method of the present disclosure are described below. In the interest of clarity, all features of an actual implementation may not be described in this specification. It will of course be appreciated that in the development of any such actual embodiment, numerous implementation-specific decisions may be made to achieve the developer's specific goals, such as compliance with system-related and business-related constraints, which will vary from one implementation to another. Moreover, it should be appreciated that such a development effort might be complex and time-consuming but would nevertheless be a routine undertaking for those of ordinary skill in the art having the benefit of this disclosure.

Reference may be made herein to the spatial relationships between various components and to the spatial orientation of various aspects of components as the devices are depicted in the attached drawings. However, as will be recognized by those skilled in the art after a complete reading of the present disclosure, the devices, members, apparatuses, etc. described herein may be positioned in any desired orientation. Thus, the use of terms such as "above," "below," "upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

The increasing complexity of electronic systems has given rise to requirements for ever increasing functionality in those electronic systems and decreasing size in the components used for the systems. In particular, personal electronic devices have an increasing number of microphones in order to detect sound in a variety of device orientations and additional sensors for new features. As the number of sensors increased, the space allocated to each sensor decreases. Embodiments of the disclosed sensor packaging arrangement provide a system and method for packaging a sensor and control chip vertically within a sensor package, reducing package size and increasing reliability and sensitivity. In some embodiments, the sensor is disposed on a first interior surface of a package cavity and the control chip is disposed on a second interior surface of the package cavity opposite the first interior surface. The sensor is connected to the control chip by one or more conductive connections that extend through the cavity. In some embodiments, the sensor is connected to the control chip by, for example, wirebond elements. The wirebond elements may be applied to the sensor before the package is enclosed. Thus, the sensor is connected to the control chip when the sensor is affixed over the control chip during finishing of the package, with the wirebond elements extending through the package cavity to connect the sensor control chip to the sensor.

The vertical arrangement of the sensor and control chip permits a smaller device package footprint than, for example, a side-by-side arrangement. Additionally, providing the control chip and sensor as separate elements avoids limitations imposed by differences in MEMS and integrated circuit production technology, where either the control chip or the sensor may differ from the other by having smaller features, different process types, different substrates, different sizes or thicknesses, different coefficients of thermal expansion (CTEs), or the like. Additionally, providing the sensor separately from the control chip avoids drift in, for example, high resolution pressure sensors caused by thermal-mechanical stress induced by the control chip elements in a system-on-chip arrangement. The sensor may be disposed on a lid made of a material with a CTE matched to that of the sensor, and the lid may be configured to minimize the effect of lid thermal expansion on the sensor.

Figure 1B:
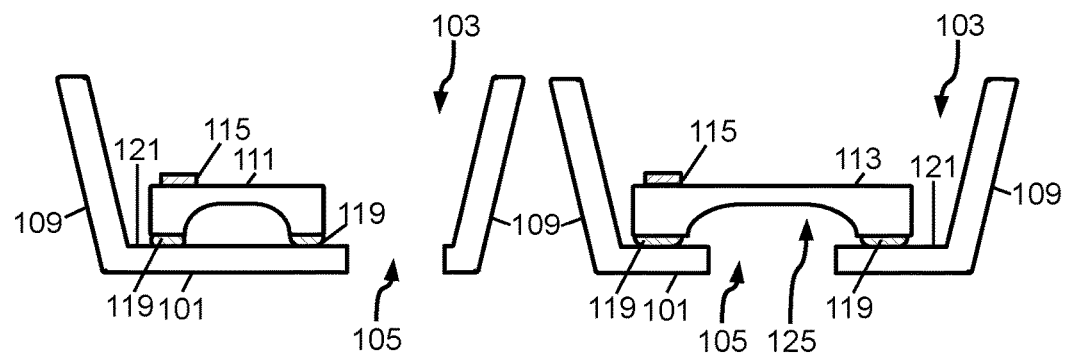
Figure 1C:
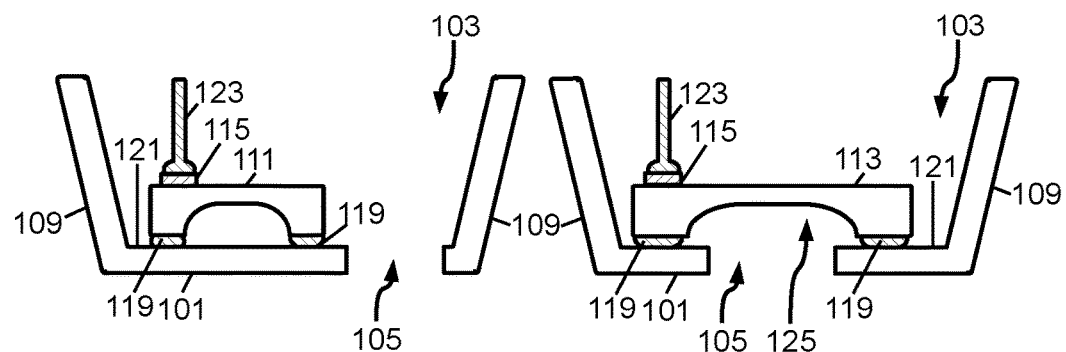

FIGS. 1A-1C illustrate formation of a first portion of a sensor package according to some embodiments. FIG. 1A illustrates lids 101 for sensor packages according to some embodiments. The first portion, or top portion, of a sensor package may include a lid 101 where a sensor will be disposed. In some embodiments, the lid 101 may have one or more side portions 109 that at least partially define a lid cavity 103. The lid 101 has a mounting surface 121 in a lateral portion disposed between the side portions. The mounting surface 121 faces the lid cavity 103.

In some embodiments, the lids 101 are formed from a polymer, a metal or another material. The lids 101 may, for example, be formed by molding a polymer using a mold, by stamping or pressing a polymer or metal sheet into a lid form, by milling, etching or otherwise removing material from a larger blank to form the lid, by additive formation, such as three dimensional (3D) printing, selective laser sintering (SLS), or the like. For sensor packages that sense environmental conditions, the lids 101 may have ports 105 providing an opening from the exterior of the sensor package to an interior cavity of the sensor package. In some embodiments, the port 105 is disposed in the lateral portion of the lid 101 between the side portions 109, and extends through the lid 101 from the lid cavity 103 to the exterior of the lid 101. In other embodiments, the port 105 may be disposed in a side portion 109 of the lid 101, for example, for a pressure sensor. In yet other embodiments, the lid 101 may have multiple ports 105 in one or both of the lateral portions or the side portions 109 of the lid 101. Furthermore, the device may have multiple ports, and the sensor may cover one or more of the of the ports and not cover some of the ports. The multiple ports may be different sizes difference shaped or vary from each other in another manner, permitting tuning of sensor and device performance. Air, gases, particulates, and the like to be sensed are able pass through the port 105 for sensing by a sensor disposed within the lid cavity 103. In some embodiments, the port 105 is disposed in about the center of the lid 101, and in other embodiments, the port 105 is disposed closer to one of the side portions 109 than to another side portion 109. In yet another embodiment, the port 105 includes multiple openings through the lid 101. While the lids 101 illustrated in FIG. 1A are shown having first lid 101 with a first port 105 that is offset from the center of the lid 101, and a second lid 101 having a port 105 that is substantially centered in the lid 101, the embodiment lids 101 are shown to illustrate a process for forming sensor packages with different port arrangements and are not limited to such an arrangement. Multiple lids 101 may be processed in a batch, and the lids 101 may have ports 105 positioned in a same position, or in different positions during processing. Additionally, in some embodiments, the lid 101 may be formed without a port, for example, in a radiation sensor package where air, particulate or gaseous materials are not required for sensing.

FIG. 1B illustrates mounting of sensors 111 and 113 in the lids 101 according to some embodiments. In some embodiments, a sensor 111 and 113 is affixed to an interior surface of the lid no. The sensor 111 and 113 may be attached to the mounting surface 121 of the lid 101 using, in some embodiments, die attachment film (DAF) 119. In other embodiments, the sensor 111 and 113 is attached using a mechanical retaining structure such as a pin, clip, screw, or other structure, using an adhesive, glue, or the like. Each sensor 111 and 113 may have one or more contact pads 115 disposed on a surface of the sensor 111 and 113. The contact pads 115 are connected to circuitry in the sensors 111 and 113, permitting a control chip (not shown) to send and receive signals with the sensors 111 and 113. In some embodiments, the contact pads 115 are disposed on a top side of the sensors 111 and 113, opposite the sensor 111 and 113 from the surface on which the sensor 111 and 113 is mounted.

In some embodiments, the sensor 111 may be attached to the interior of the lid 101 so that the sensor 111 is laterally spaced apart from port 105, and in other embodiments, the sensor 113 may be attached to the interior of the lid 101 so that the sensor 113 is aligned over, or covers, the port 105. The arrangement of the sensors 111 and 113 in relation to the ports 105 may be determined by the type of sensor 111 and 113. For example, a sensor 111 may be a top sensing sensor having a sensing side on the top surface of the sensor 111. A top sensing sensor is may be spaced apart from the port 105 so that air or environmental material moving through the port 105 is unimpeded to the top surface of the sensor 111. In another example, a sensor 113 may be a "bottom sensing sensor," and may have a sensor cavity 125 that is aligned over the port 105. Aligning the bottom sensing sensor over the port 105 permits air or environmental material to move directly through the port 105, and through the sensor cavity 125, to the bottom surface of the sensor 113.

FIG. 1C illustrates mounting of interconnects 123 according to some embodiments. In some embodiments, interconnects 123 are formed on the contact pads 115 of the sensors 111 and 113. The interconnects 123 may, in some embodiments, be formed as stud bumps using a wirebond process where a wirebonding machine bonds a first end of a wire to the contact pads 115, using, for example, a ball-bond. The interconnects 123 are a conduct material, and in some embodiments, may be formed from copper wire, gold wire, aluminum wire, and may be plated, doped or otherwise alloyed to customize the interconnect 123. The wirebonding machine forms a ball at the end of an exposed wire using, for example, an electric flame-off, and may weld, fuse or otherwise attach the ball end of the interconnect to the contact pad 115 using, for example, heat, pressure, and/or ultrasonic vibration. After the ball end of the wire is attached to the contact pad 115, the wirebonding machine may cut the wire to form a second end of the interconnect 123. After the interconnect 123 is formed, the interconnect 123 has a first end bonded to the contact pad 115, and extends into the lid cavity 103 away from the sensor 111 and 113 and the mounting surface 121 of the lid 101. In some embodiments, a second end of the interconnect 123 is about level with the ends of the side portions 109 of the lid so that the lid, with the interconnect 123, may be mounted on a substantially flat surface.

In other embodiments, the interconnect 123 is a solder ball, a solder ball with a supporting structure, a preformed structure that is placed on the contact pad, a printed structure or structure that is formed in place on the contact pad 115. In some embodiments, solder paste, solder, conductive adhesive, or another conductive material is disposed on the contact pads 115, and the interconnect 123 may be bonded to the contact pad 115 by reflow, curing, or the like. The interconnects 123 may also be attached to the contact pads 115 prior to the sensors 111 and 113 being attached to the lid 101.

Figure 2A:
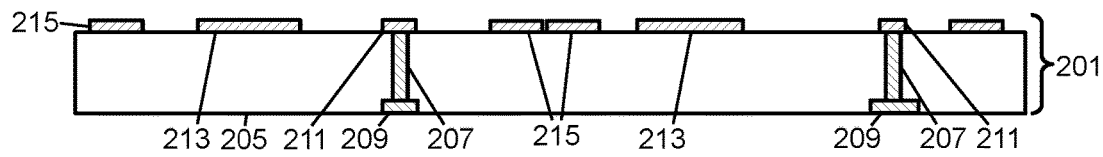
FIGS. 2A-2D illustrate formation of a second portion of a sensor package and assembly of the sensor package according to some embodiments.

FIGS. 2A-2D illustrate formation of a second portion of a sensor package and assembly of the sensor package according to some embodiments. FIG. 2A illustrates a package base 201 for a sensor package according to some embodiments. The package base 201 may have one or more landing pads 213 and via pads 211 disposed on a top side or first surface of a substrate 205. The substrate 205 may have a body that is an insulating material such as a polymer, fiberglass, an oxide, ceramic, or the like. The via pads 211 may be conductive and connected to a via 207 formed from a conductive material, and may extend through the substrate 205 to a package mounting pad 209 disposed on a bottom side or second surface of the substrate 205. The substrate body electrically insulates the landing pads 213, the via pads 211, vias 207 and package mounting pads 209 from each other. The vias 207 or landing pads 213 may extend laterally through, or on, the substrate 205 by way of metallization layers or the like disposed in the body of the substrate 205, permitting multiple landing pads and vias to be redirected and cross each other in different layers without being in electrical contact.

Figure 2B:
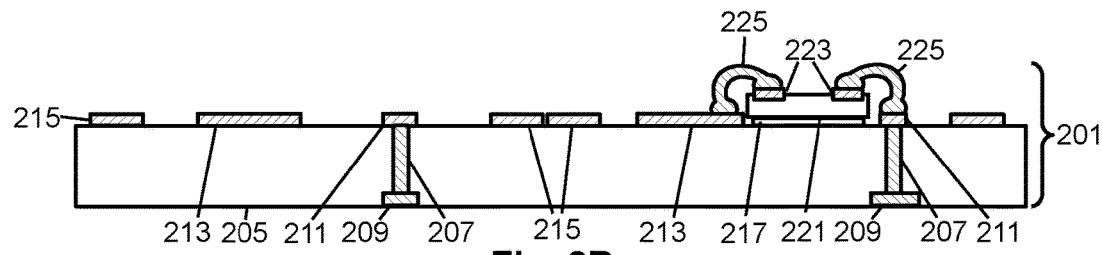

In some embodiments, one or more stopper pads 215 are formed on the top side or first surface of the substrate 205. The stopper pads 215 may be formed from a conductive material, and in some embodiments, are formed as part of a metal layer with the landing pads 213 and the via pads 211, by metal deposition and patterning, printing of a conductive material, or the like. The stopper pads 215 may have top surfaces that are substantial level or coplanar with top surfaces of the landing pads 213 or via pads 211. The stopper pads 215 may be formed to encircle the area on which control chips will be mounted to form a contiguous region on which a lid may be mounted FIG. 2B illustrates attachment of a wirebonded control chip 221 according to some embodiments. In some embodiments, a package includes a wirebonded control chip 221. The control chip 221 may be an ASIC, communications device, an interface device, or the like, and may have circuitry that controls, or reads a sensor. The control chip 221 is attached to the substrate 205 by a die attachment structure 217 such as DAF, adhesive, tape, or the like. In other embodiments, the control chip 221 is attached to the substrate 205 with a mechanical retainer such as a clip, socket, screw, or the like. The control chip 221 has one or more control bond pads 223 disposed on a top side, and is electrically connected to a via pad 211 or a landing pad 213 or the like using wirebond connections 225.

Figure 2C:
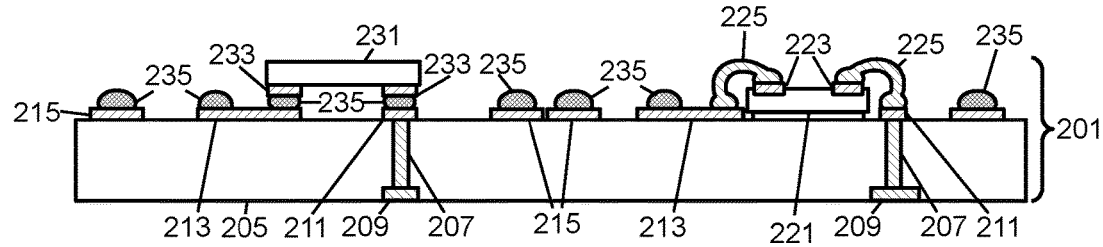

FIG. 2C illustrates attachment of a pad mounted control chip 221 according to some embodiments. Conductive connectors 235 may be applied to one or more of the via pads 211 and landing pads 213. In some embodiments, the conductive connectors 235 are solder, solder paste, a conductive adhesive, conductive glue, or the like. Additionally, the conductive connectors 235 may also be applied to the stopper pads 215, or a nonconductive adhesive material may be applied to the stopper pads 215 for subsequent mounting of a lid 101 on the stopper pads 215. The pad mounted control chip 231 is attached to a via pad 211 or landing pad by the conductive connectors 235.

In some embodiments, a package includes a control chip 221 mounted by way of mounting pads 233 that are disposed on a bottom side of the control chip 231. While the package base 201 illustrated in FIG. 2C is shown with a wirebonded chip 221 and a pad mounted control chip 231, the different types of control chips are shown purely for illustrative purposes, and is not intended to be limiting. A package base 201 may be formed with any number of control chips of the same type, or may have different types of control chips.

Figure 2D:
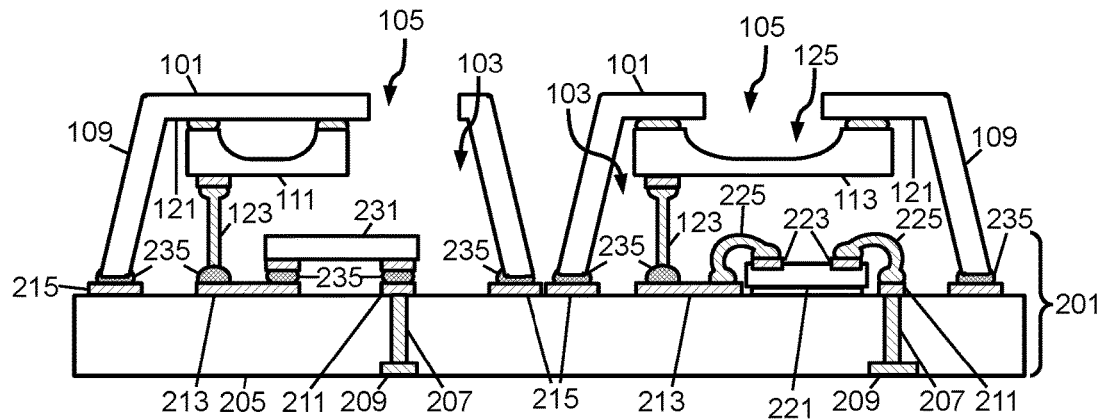

FIG. 2D illustrates mounting of lids 101 on the package base 201. Ends of the side portions 109 of the lids 101 are attached to the package base 201. In some embodiments, the side portions 109 are affixed to the stopper pads 215 by the conductive connectors 235. After attachment of the lids 101 to the package base, 201, the control chips 231 and 221 are disposed within the lid cavity 103, which creates an interior cavity for the package, with the interior cavity bounded by the lid 101 and the substrate 205. Since the interior cavity of the package is created by separation of the mounting surface 121 from the top surface of the substrate 205, the interior cavity may have a volume that is determined by the length and angle of the side portions 109 of the lid 101, allowing customization of the interior cavity volume according to the requirements of the sensors 111 and 113. Thus, a sensor package may have a body structure that includes the substrate 205 and lid 101, and that has an interior cavity that includes the lid cavity 103. The sensor 111 and 113 is disposed on a first interior surface of the interior cavity, and the control chip 221 and 231 is disposed on a second interior surface of the interior cavity and physically separated from the sensor by an air gap. The sensor 111 and 113 is electrically connected to the control chip 221 and 231 by an interconnect 123 that extends across the air gap from the sensor 111 and 113 to a landing pad 213 on the substrate 205.

The interior cavity of the sensor package may act as a back volume, while the sensor cavity 125 may act as a front volume for a sensor 113 disposed over the port 105. The front volume, or sensor cavity 125, provides an opening for air, pressure waves, or other environmental material to reach the active or measurement elements of the sensor 113. For sensors that are microphones, the sensor cavity 125 may be a front volume that creates resonance in air interacting with the port 105 and the sensor cavity 125, increasing the sensitivity of the microphone. A larger volume of air in the back chamber, or lid cavity 103, makes it easier for the membrane or sensing element of the sensor 113 to move in response to sound waves, which improves the sensitivity of, for example, a sensor microphone, and leads to higher signal-to-noise ratio (SNR). A large back volume also improves, for example, a sensor microphone low frequency response.

The interconnects 123 are secured to the landing pads 213 by the conductive connectors 235, electrically connecting the respective sensors 111 and 113 to a respective control chip 221 and 231 through the landing pads 213. In some embodiments, the sensors 111 and 113 may at least partially overlap the respective control chip 221 and 231 in a lateral direction while being spaced part in a vertical direction. Thus, an air space or air gap is provided between the sensors 111 and 113 and the respective control chip 221 and 231. The air gap provides physical separation between the sensors 111 and 113 and the respective control chip 221 and 231 to reduce stress transferred to the sensor 111 and 113 while acting as a back volume for the sensor 111 and 113. In some embodiments, a sensor 113 may completely overlap the control chip 221 in the lateral direction, while being spaced apart from the control chip 221 in the vertical direction. Thus, the sensor 113 may have lateral extents that extend laterally past lateral extents of the control chip 221.

In some embodiments, the interconnects 123 may extend from the sensor 111 and 113 to a contact pad on a respective control chip 221 and 231, eliminating the need for a landing pad. In some embodiments, an interconnect 123 may be formed on an interior surface of the lid 101 and may extend to a contact pad on a control chip 221 and 231 or landing pad 213 on the substrate 205, for example, to ground the lid 101. In other embodiments, the sensors 111 and 113 may be electrically connected to the control chips 221 and 231 by conductive lines formed in or on the lids 101, and which connect to elements of the stopper pads 215 or to other conductive elements on the substrate 205.

Figure 3:
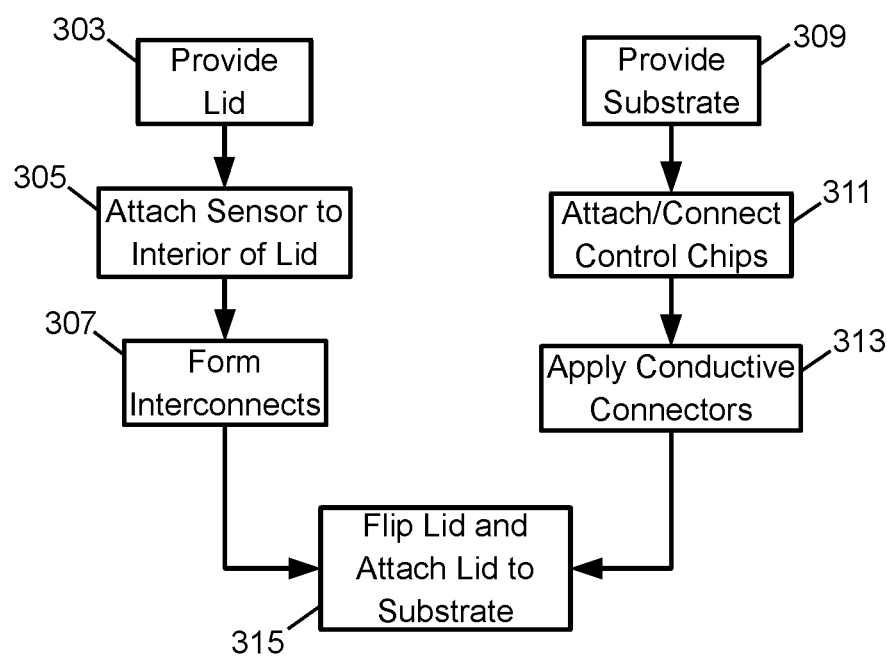
FIG. 3 is a flow diagram illustrating a method for forming a sensor package according to some embodiments.

FIG. 3 is a flow diagram illustrating a method 301 for forming a sensor package according to some embodiments. In block 303, a lid is provided, and in block 305, a sensor is attached to an interior surface of the lid. In block 307, one or more interconnects are formed.

In block 309, a substrate is provided, and in block 311, control chips are attached and/or connected to the substrate. In some embodiments, the control chips may be mounted on the substrate and wires may be used to electrically connect the contact pads of the control chips to contact pads, such as via pads or landing pads, on the substrate. In block 313, one or more conductive connectors are applied to pads on the substrate, and in some embodiments, the conductive connectors are applied to stopper pads, landing pads, or via pads. Additionally, in some embodiments, the conductive connectors may be applied before the control chips are connected, so that pad mounted control chips are affixed to contact pads on the substrate by the conductive connectors. In block 315, the lid with attached sensor is flipped and bonded to the substrate.

Figure 4A:
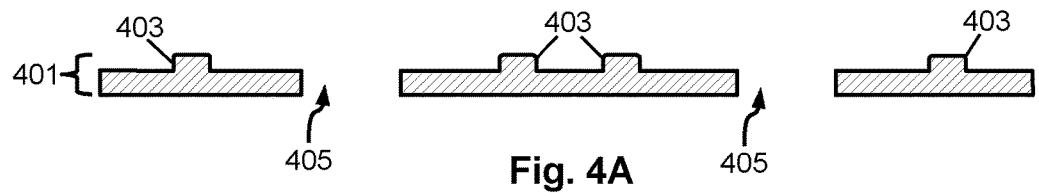
FIGS. 4A-4C illustrate formation of a first portion of a shielded sensor package according to some embodiments.
Figure 4B:
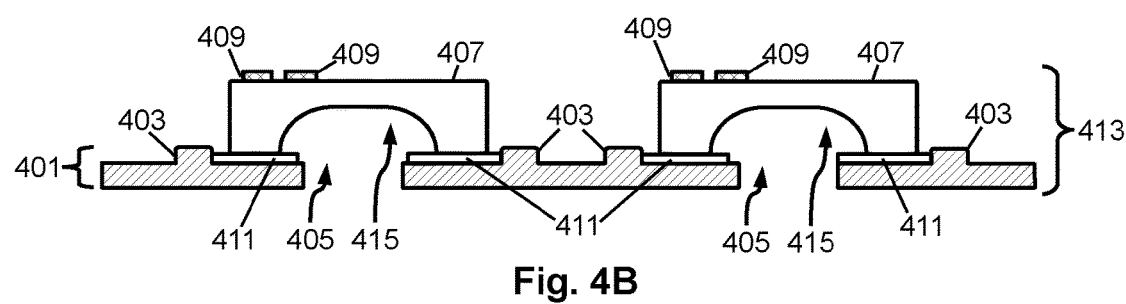
Figure 4C:
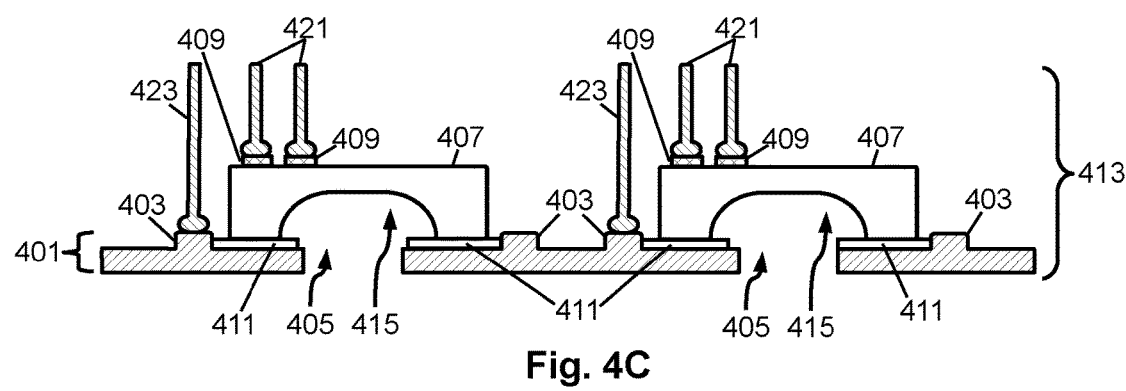

FIGS. 4A-4C illustrate formation of a first portion 413 of a shielded sensor package according to some embodiments. FIG. 4A illustrates a frame 401 for a package according to some embodiments. The frame 401 includes portions that form one or more lids in an assembled shielded sensor package. The frame 401 may have one or more ports 405 that extend through the frame 401. The frame 401 may also have bleed stop ridges 403 formed on one side of the frame 401. The bleed stop ridges 403 may be raised areas on the top surface of the frame 401, and each bleed stop ridge 403 may be formed to surround a respective port 405, and provide a physical barrier that prevents material applied to the top surface of the lid 101 from bleeding, or running outside of the bleed stop ridges 403.

In some embodiments, the frame 401 is the structure used to form lids used in a sensor package, and may be formed from a conductive material to provide electromagnetic interference (EMI) shielding for the package. In some embodiments, the frame 401 may be made from copper, gold, aluminum, or another metal or alloy, and may be formed by molding, by chemical or plasma etching, by milling, by stamping, or by another formation process. In other embodiments, the frame 401 may be made from a conductive material, such as a molding compound having conductive material disposed therein, or a conductive polymer such as an epoxy, molding compound, or the like.

FIG. 4B illustrates mounting of sensors 407 on the frame 401 to form the first portion 413 of the shielded sensor package according to some embodiments. An adhesive 411 such as a glue, epoxy, DAF, or the like, is deposited on the top surface of the frame 401 within the bleed stop ridges 403, which contain the adhesive 411. The bleed stop ridges 403 prevent the adhesive 411 from flowing between areas designated for different lids or packages.

In some embodiments, sensors 407 are mounted on the adhesive 411 so that the sensors 407 are affixed to the top surface of the frame 401. In some embodiments, each of the sensors 407 may be attached to the frame 401 spanning a port 405, for example, for a top port sensor package. Each of the sensors 407 may have a sensor cavity 415 or the like that acts as a front chamber or front volume for the sensor 407. In other embodiments, the sensors 407 may be laterally offset from the ports 405 or formed between multiple ports, and in bottom port arrangements, the lid may be formed without ports.

FIG. 4C illustrates mounting of interconnects 421 and 423 on the first portion 413 of the shielded sensor package according to some embodiments. The interconnects 421 and 423 may include frame interconnects 423 that are mounted on, and in electrical contact with the frame 401. In some embodiments, the frame interconnects 423 are mounted on the bleed stop ridges 403, or on another exposed portion of the frame 401, and may provide a ground connection for the frame 401 or lids. The interconnects 421 and 423 may also include sensor interconnects 421 that are mounted on sensor landing pads 409 disposed on a top side of the sensors 407. The interconnects 421 and 423 may be wirebond structures formed using a wirebond machine, and may be formed as discussed above. The interconnects 421 and 423 have a first end disposed on the frame 401 or on the sensor 407, and extend away from the frame 401. Second ends of the interconnects 421 and 423 are opposite the first ends of the interconnects 421 and 423 that are mounted to the frame 401 or sensor landing pads 409. In some embodiments, the second ends of the interconnects 421 and 423 are substantially level or coplanar to facilitate mounting of a lid that is formed from part of the first portion 413. In other embodiments, the interconnects 421 and 423 are solder balls, solder balls with supporting structures, preformed structures that are placed on the contact pad, printed structures or structures that are formed in place on the frame 401 or sensor landing pads 409.

Figure 5A:
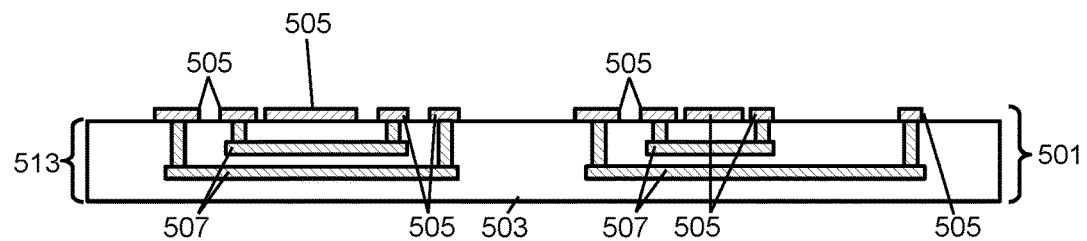
FIGS. 5A-5H illustrate formation of a second portion of a shielded sensor package, and mounting of the first portion on the second portion according to some embodiments.

FIGS. 5A-5F illustrate formation of a second portion of a shielded sensor package according to some embodiments. FIG. 5A illustrates a second portion 501 of a shielded sensor package according to some embodiments. The second portion 501 may have one or more pads 505 disposed at a surface of a substrate 513, and may be interconnected by one or more metal lines 507 on the substrate 513 or in a substrate body 503.

Figure 5B:
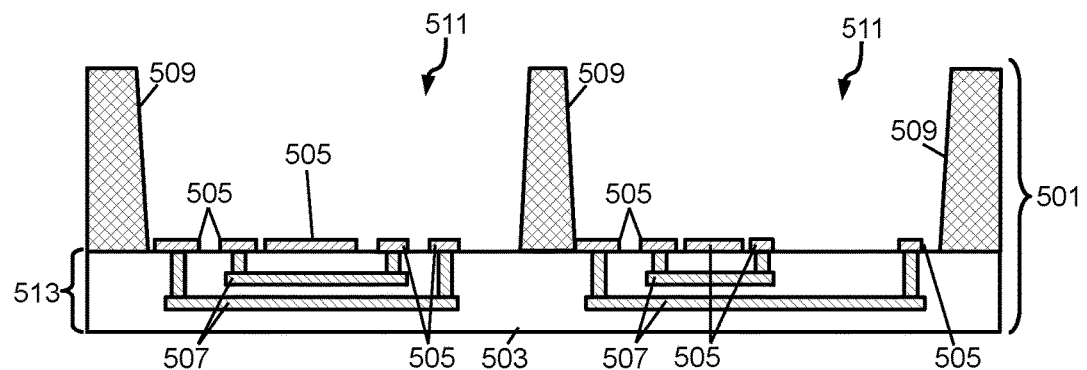

FIG. 5B illustrates formation of sidewalls 509 on the second portion 501 according to some embodiments. In some embodiments, the sidewalls 509 are formed on the substrate body 503, and in other embodiments, the sidewalls 509 may be formed on a stopper pad, oxide or sealing layer, or the like, that is disposed on a surface of the substrate 513.

In some embodiments, the sidewalls 509 are formed from an elastomer molding compound, with the sidewalls 509 comprising a conductive material so that the sidewall 509 are conductive. Conductive sidewalls provide EMI shielding for sensors 407 and control chips 515 and 529 disposed within an interior cavity 511 bounded by the sidewalls 509 and substrate 513. In some embodiments, the conductive material is a conductive filler disposed throughout the material forming the sidewall 509. For example, the conductive material may be carbon (C), such as carbon black, or may be passivated aluminum (Al), silver plated Al (Ag/Al), Ag plated copper (Al/Cu), Ag plated glass, Ag plated nickel (Ag/Ni), Ni coated carbon, Ni, Ag, Cu, or another conductive material. The elastomer material may be a molding compound, epoxy, polymer, or the like. In other embodiments, the sidewalls 509 may be a plated elastomer, where the elastomer is formed and then plated with the conductive material.

The sidewall 509 may be formed by molding the sidewall in place, by 3D printing, by pre-forming the sidewall 509 and attaching the sidewall 509 to the substrate 513, or another forming process. The sidewall 509 is formed to contiguously surround a die area and one or more of the pads 505, and extend away from the substrate 513 to provide the interior cavities 511.

Figure 5C:
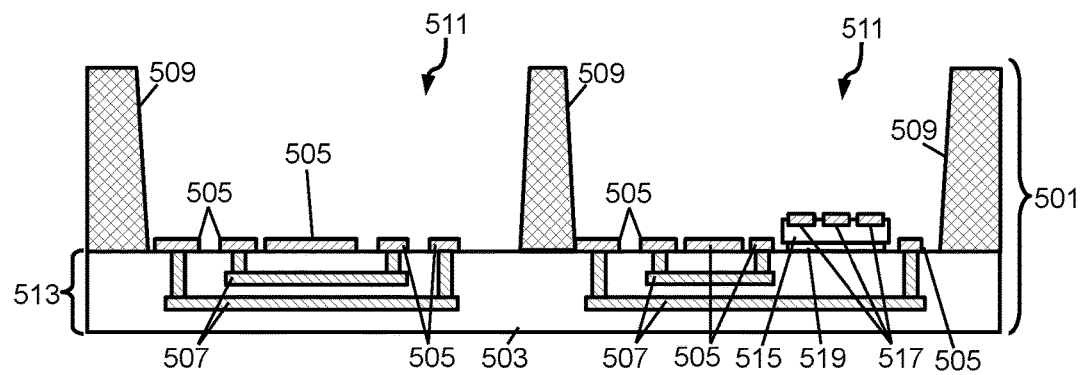

FIG. 5C illustrates attachment of a control chip 515 according to some embodiments. The control chip 515 may be an ASIC, communications device, an interface device, or the like, and may have circuitry that controls, or reads a sensor. The control chip 515 is attached to the substrate 513 by a die attachment structure 519 such as DAF, adhesive, tape, or the like. In other embodiments, the control chip 515 is attached to the substrate 513 with a mechanical retainer such as a clip, socket, screw, or the like. The control chip 515 has one or more control chip bond pads 517 disposed on a top side that faces away from the substrate 513.

Figure 5D:
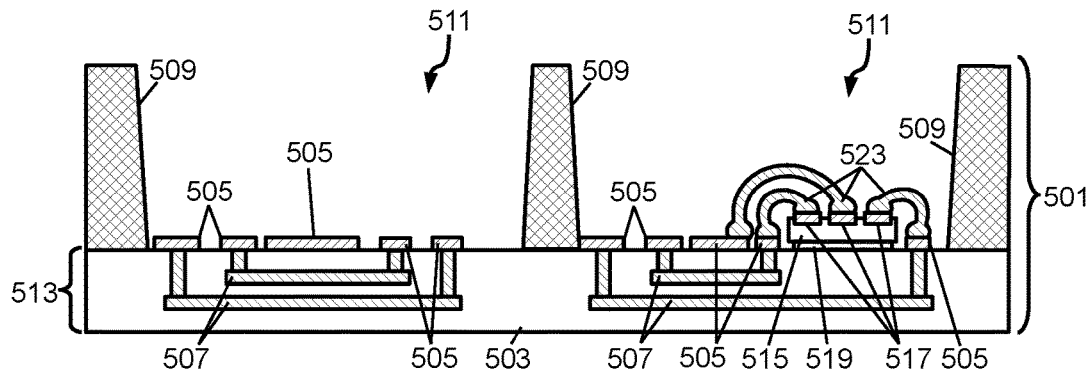

FIG. 5D illustrates wirebonding of the control chip 515 to one or more pads 505 according to some embodiments. In some embodiments, the control chip 515 is a wirebonded control chip and is electrically connected to one or more of the pads 505 using wirebond connections 523.

Figure 5E:
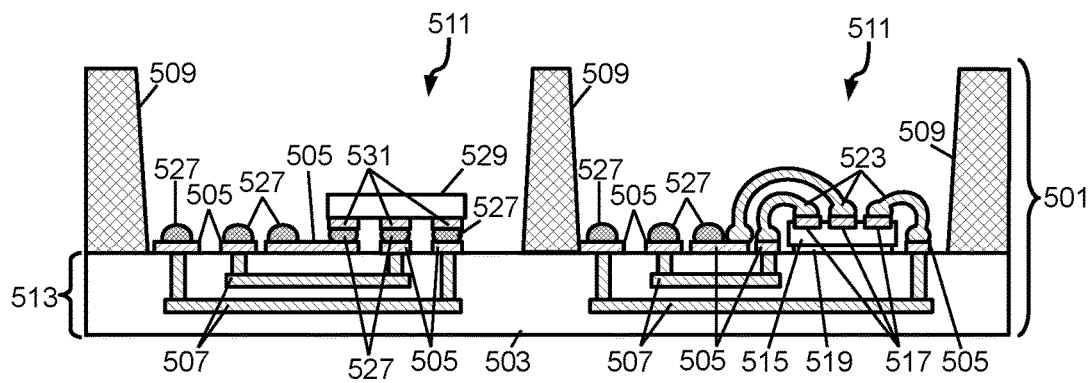

FIG. 5E illustrates attachment of a pad mounted control chip 529 according to some embodiments. Conductive connectors 527 may be applied to one or more of the pads 505. In some embodiments, a package includes a control chip 529 mounted by mounting pads 531 disposed on a bottom side of the control chip 529. The pad mounted control chip 529 is attached to pads 505 by the conductive connectors 527. While the second portion 501 of the shielded sensor package illustrated in FIG. 5E is shown with a wirebonded control chip 515 and a pad mounted control chip 529, the different types of control chips 515 and 529 are shown purely for illustrative purposes, and is not intended to be limiting.

Figure 5F:
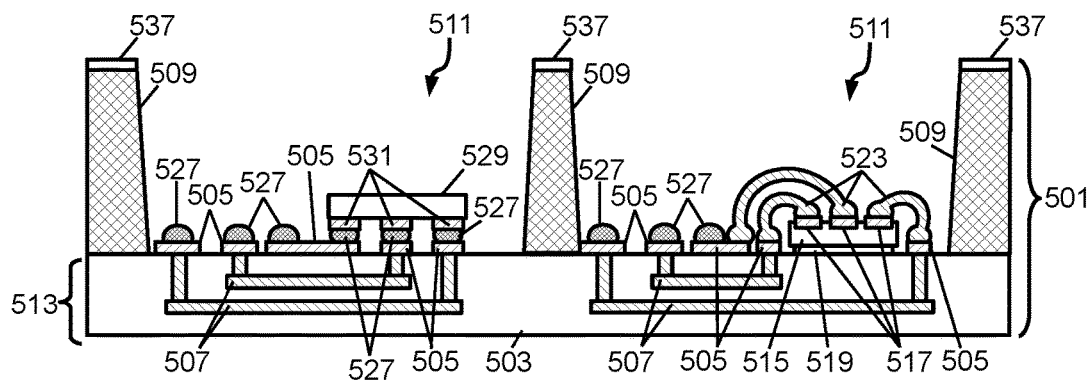

FIG. 5F illustrates application of a lid connector 537 to the sidewalls 509 according to some embodiments. The lid connector is disposed on second ends of the sidewalls 509, and may be a glue, DAF, epoxy, or another adhesive or attachment structure.

Figure 5G:
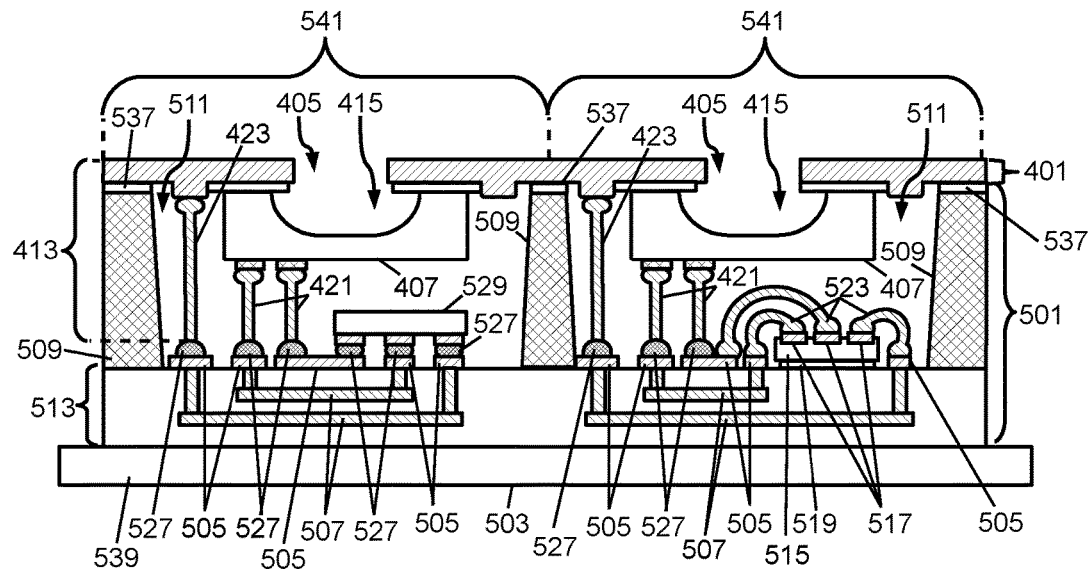
Figure 5H:
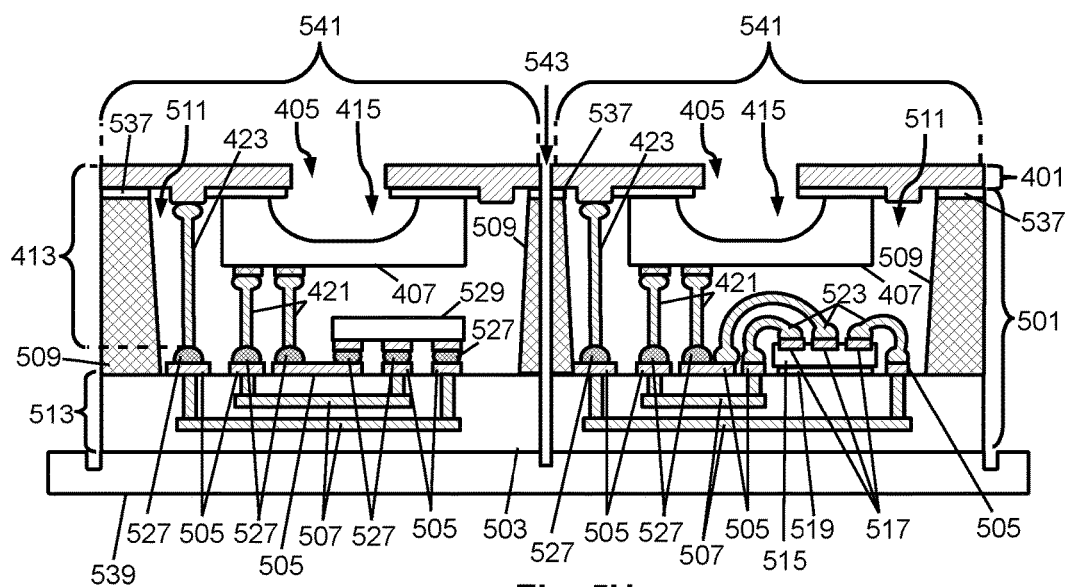

FIGS. 5G-5H illustrate assembly of shielded sensor packages 541 according to some embodiments. FIG. 5G illustrates attachment of the first portion 413 to the second portion 501. The first portion 413 is inverted and affixed to the second portion 501 by the lid connectors 537 to enclose the interior cavity 511. Additionally, the interconnects 421 and 423 are attached to the pads 505 of the second portion and affixed by the conductive connectors 527. In some embodiments, the top surfaces of the pads 505 are substantially level, so that the ends of the interconnects 421 and 423 make consistent contact with respective pads 505. In some embodiments, each of the interconnects 421 and 423 extend from the first portion 413 of the shielded sensor package 541 so that a second end of each of the interconnects 421 and 423 is in electrical contact with a different contact pad 505 on the surface of the substrate 513. In other embodiments, one or more of the interconnects 421 and 423 contacts a control chip bond pad 517, or another landing pad, contact pad, or the like. Thus, the sensor 407 may be connected to a respective control chip 515 and 529 by way of the sensor interconnects 421 while the sensor and respective control chip 515 and 529 are spaced apart.

The sidewalls 509 and frame 401 form a conductive shell providing EMI shielding for the enclosed control chips 515 and 529 and sensors 407. In some embodiments, the substrate 513 also has a shielding layer (not shown), increasing the EMI shielding of the packages 541. Additionally, in the arrangement illustrated, the interior cavity 511 acts as a back volume for the sensor 407, while the sensor cavity 415 acts as front volume.

After the first portion 413 is mounted on the second portion 501, the packages 541 may be cured, reflowed, or the like to set, cure, or reflow the lid connectors 537 and conductive connectors 527. The packages 541 may also be mounted on a carrier 539 such as a tape or the like.

FIG. 5H illustrates singulation of the packages 541 according to some embodiments. The first portion 413 and second portion 501 of the packages 541 are cut, for example, by die sawing, laser cutting, or the like, to form cut region 543 and separate the individual package 541 while maintaining the packages 541 on the carrier 539 for shipping and installation.

While the packages 541 are illustrated with the port 405 disposed in the frame 401, it should be understood that the packages 541 may be formed with one or more ports 405 in other parts of the package 541, or with no port. For example, the package 5451 may be a bottom port package with a port extending through the substrate 513, or through a sidewall 509. In other embodiments, the packages 541 may be formed without a port, for example, for a radiation sensor or the like. In yet other embodiments, the package 541 may be formed with multiple ports which may be of similar size and shape, or may differ in size or shape.

Figure 6:
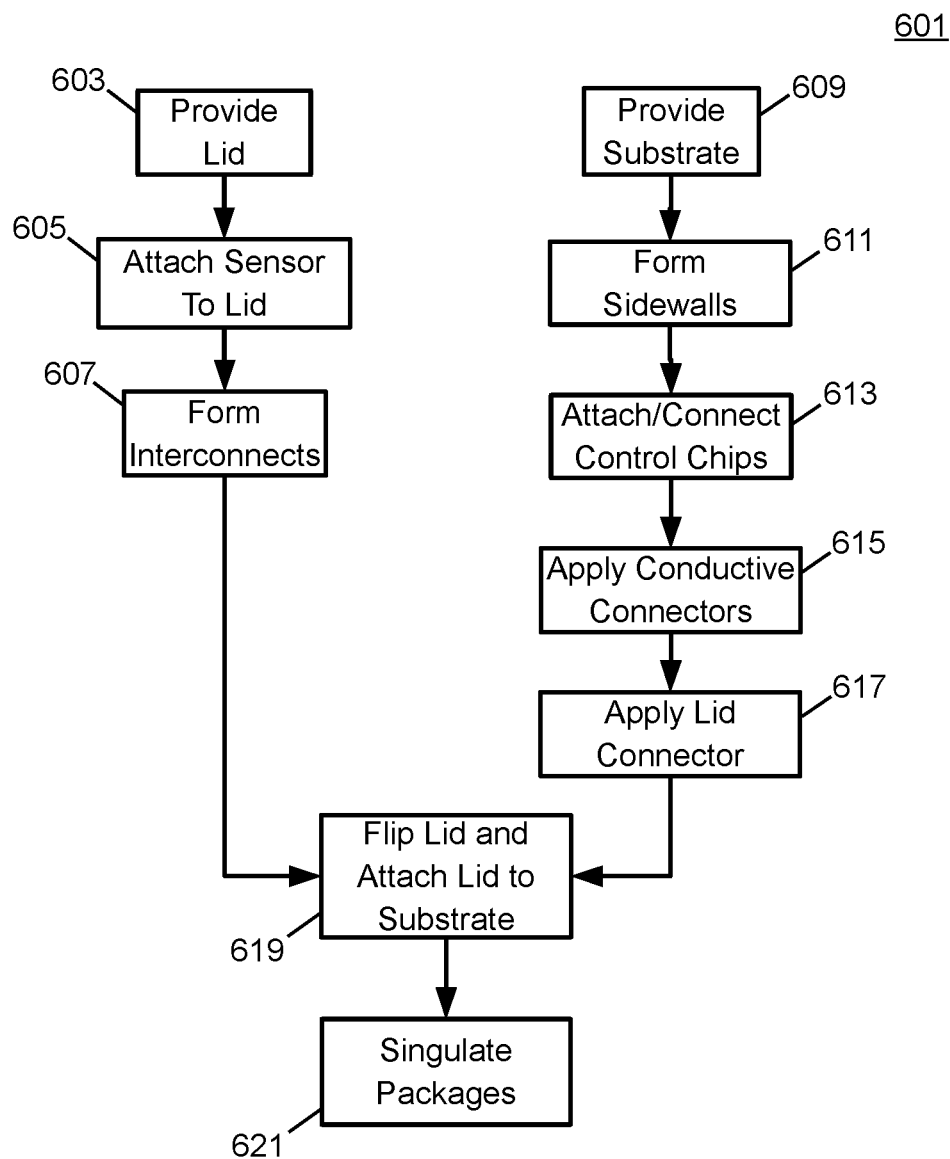
FIG. 6 is a flow diagram illustrating a method for forming a shielded sensor package according to some embodiments.

FIG. 6 is a flow diagram illustrating a method 601 for forming a shielded sensor package according to some embodiments. In block 603, a lid is provided. In some embodiments, the lid is formed from a conductive material and is part of a frame or the like. In block 605, a sensor is attached to the lid, and in block 607 interconnects are formed. In some embodiments, the interconnects are wirebond structures that have a first end mounted on the lid or on the sensor, with a second end extending away from the lid. In other embodiments, the interconnects are other rigid conductive structures, solder balls, or the like.

In block 609 a substrate is provided. In some embodiments, the substrate has one or more pads, and also has one or more metal lines disposed in the body of the substrate connecting the pads to each other, or to pads on an opposite side of the substrate.

In block 611, sidewalls are formed on the substrate. In some embodiments, the sidewalls have an embedded conductive material or conductive plating. In block 613, a control chip is mounted to the substrate and electrically connected to the pads of the substrate. In block 615, one or more conductive connectors are applied to the pads. In some embodiments, the control chip may be pad mounted connected to the pads and affixed by the conductive connectors. In other embodiments, the control chip may be a wirebonded control chip that is affixed to the substrate by a DAF, adhesive or the like, and electrically connected to the pads by wirebond connections.

In block 617, a lid connector such as an adhesive, glue, DAF, conductive structure or the like, is applied to the sidewalls, and in block 619, the lid is flipped and attached to the substrate by way of the lid connector. In some embodiments, attaching the lid to the substrate includes bringing the second ends of the interconnects into contact with the pads on the substrate and the conductive connectors. Thus, after the lid is attached to the substrate, the sensors are spaced apart from the control chip by an air gap, and are electrically connected to the control chips by way of connectors spaced apart from the sidewalls and passing through the interior cavity of the package. In block 621, the packages are singulated by cutting between packages.

Figure 7:
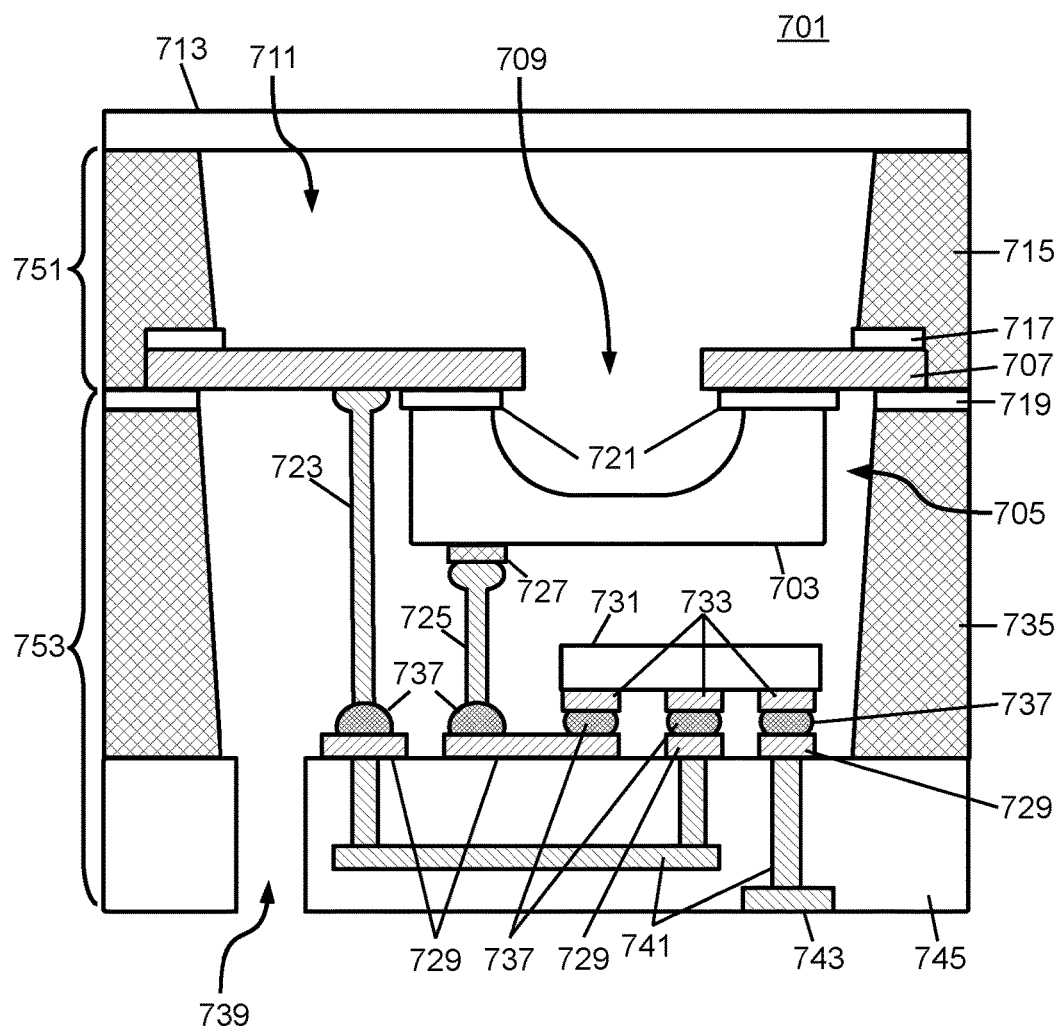
FIG. 7 illustrates a shielded sensor package with an enclosed back volume according to some embodiments.

FIGS. 2D and 5G-5H illustrate top port packages, where the port is disposed in the lid. However, the formation of the package according the embodiments is not limited to top port packages, as bottom port packages may also be formed with sensors stacked over, and spaced apart from, the control chips. FIG. 7 illustrates a bottom port shielded sensor package 701 with an enclosed back cavity 711 according to some embodiments. The package 701 has a back volume portion 751 and a front volume portion 753. The back volume portion 751 has first sidewalls 715 separating a top lid 713 from a center lid 707. The center lid 707 may have a port 709 extending to the back cavity 711, which acts as a back volume for a sensor 703 mounted over the port 709 on a bottom surface of the center lid 707. The sensor 703 may be mounted on the bottom surface of the center lid 707 by way of a sensor attachment structure 721 such as a DAF, adhesive, epoxy, or the like. The center lid 707 is attached to the first sidewalls 715 by way of a first attachment structure 717 such as an adhesive, tape, epoxy, or the like. One or more lid interconnects 723 may be formed on the center lid 707 and may extend through the front cavity 705, and one or more sensor interconnects 725 may be mounted on mounting pads 727 of the sensor 703 and may extend through the front cavity 705.

The front volume portion 753 has a substrate 745 with an external port 739 passing from the exterior of the package 701 through the substrate 745 to the front cavity 705. The substrate has one or more pads 729 and one or more metal lines 741 connecting the pads 729 to each other or to a mounting pad 743. A control chip 731 is mounted by conductive connectors 737 such as solder paste, solder balls, or the like. The conductive connectors 737 connect mounting pads 733 on the control chip 731 to one or more of the pads 729. The front volume portion 753 may further have second sidewalls 735 formed on the substrate 745 surrounding the control chip 731 to at least partially define the front cavity 705.

The back volume portion 751 is mounted on the front volume portion 753 by way of a second attachment structure 719 such as an adhesive, tape, epoxy, or the like. The second attachment structure 719 may be disposed on an end surface of the second sidewalls 735 to hold the center lid 707 above the second sidewalls 735 with the sensor 703 aligned at least partially over the control chip 731 while maintaining a separation or air gap between the sensor 703 and the control chip 731 in the front volume. The lid interconnects 723 and sensor interconnects 725 extend through the front cavity 705 so that second ends of the interconnects 723 and 725 make electrical contact with the pads 729 and are affixed to the pads 729 by the conductive connectors 737. Thus, in some embodiments, the center lid 707, in some embodiments, may have a ground connection to the control chip 731 provided by the lid interconnect 723, or, in other embodiments, to a mounting pad disposed on the bottom of the substrate 745. Similarly, in some embodiments, the sensor 703 may be in electrical contact with the control chip 731 by way of the sensor interconnect 725.

In some embodiments, EMI shielding may be provided for the sensor 703 and control chip 731 by the center lid 707 and the second sidewalls 735. The EMI shielding may be achieved, for example, by forming the center lid from a conductive material, as described above, and forming the second sidewalls 735 with a conductive material, as described above. In such an embodiment, the top lid 713 and first sidewall 715 may be formed from an elastomer, polymer, epoxy, or the like and may be formed from a nonconductive material since the sensor 703 and control chip 731 are enclosed in the conductive structure of the center lid 707 and second sidewalls 735. In other embodiments, the first sidewall 715 and/or top lid 713 may be formed from, or with, a conductive material to provide additional EMI shielding.

In some embodiments, the control chip 731, substrate 745 and pads 729 and second sidewalls 735 may be produced or provided as described above to form the front volume portion 753. The sensor 703 and interconnects 723 and 725 may also be attached to the center lid 707 as described above. The top lid 713 may be provided, and the first sidewalls 715 may be formed on the top lid 713, with the center lid 707 subsequently mounted on the first sidewalls 715 to form the back volume portion 751. The back volume portion 751 may then be mounted on the front volume portion 753.

In other embodiments, the center lid 707 may be provided, and the first sidewalls 715 may be formed on the center lid 707 by molding, or the like, and the top lid 713 attached to the first sidewalls 715 to form the back volume portion 751. The back volume portion 751 may then be mounted on the front volume portion 753.

Figure 8A:
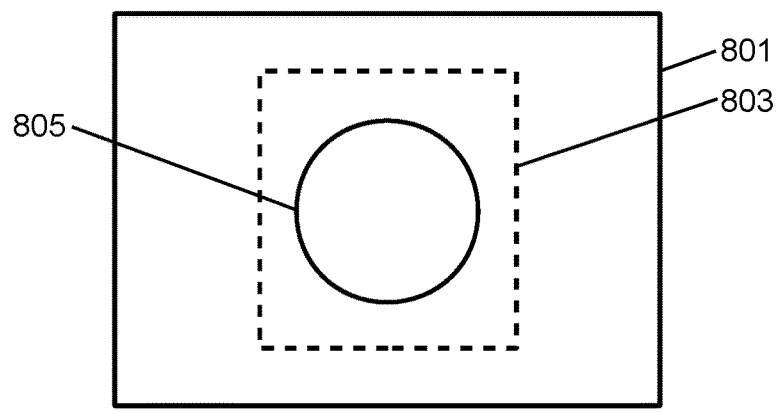
FIGS. 8A-8C illustrate various lid and port arrangements according to some embodiments.
Figure 8B:
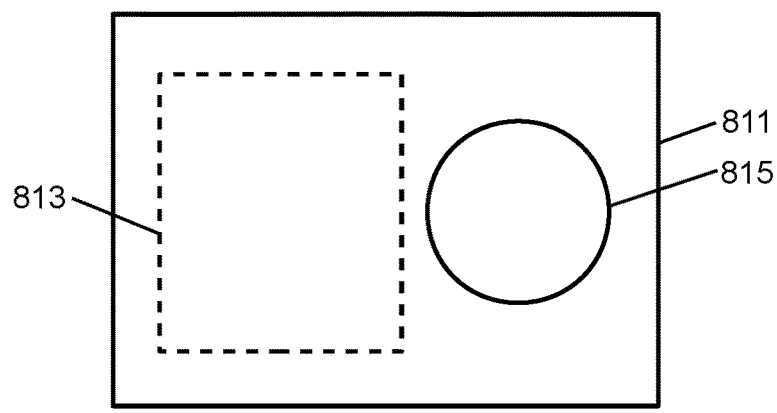
Figure 8C:
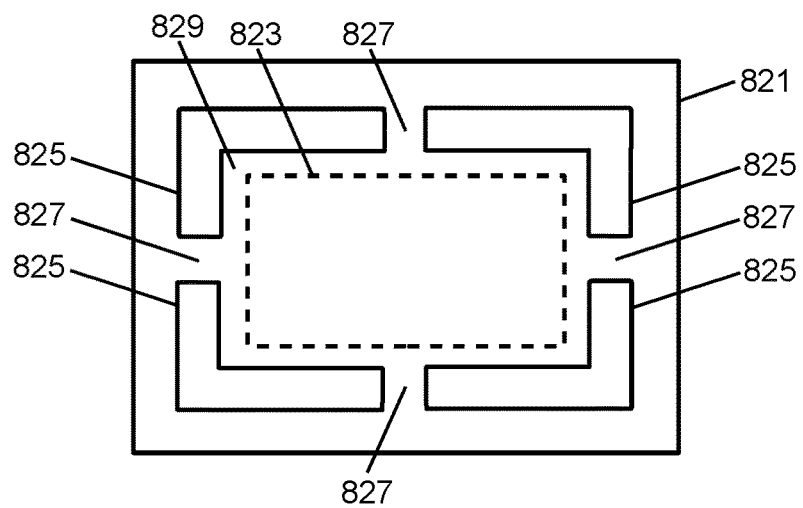

FIGS. 8A-8C illustrate various lid and port arrangements according to some embodiments. FIG. 8A illustrates a top port lid 801 with a port 805 disposed in a middle region of the lid 801. A sensor mounting region 803 overlies the port 805, so that a sensor disposed in the sensor mounting region 803 covers, or is aligned with, the port 805.

FIG. 8B illustrates a top port lid 811 with a port 815 that is offset from a center or middle region of the lid 811 according to some embodiments. Offsetting the port 815 towards a side of the lid 811 permits space for a sensor mounting region 813 that is adjacent to the port 815. Thus, a sensor disposed in the sensor mounting region 813 is adjacent to, and nonaligned with, the port 815.

FIG. 8C illustrates a top port lid 821 with multiple ports 825 according to some embodiments. The lid 821 may have multiple ports 825 disposed around a sensor mounting region 823, creating a stress reduction region 829 in the lid 821. The stress reduction region 829 is connected the remainder of the lid 821 by bridge regions 827 between the multiple ports 825. The use of the multiple port 825 reduces transmission of at least a portion of the stresses introduced to the lid 821 by, for example, thermal stress in the sidewalls of a package, to a sensor mounted in the sensor mounting region 823. Having the multiple ports 825 that form corners of the stress reduction region leaves portions of the lid 821 to expand, contract, or move without affecting the stress reduction region 829 and associated sensor. This is because the multiple ports 825 at least partially decouple the edge of the lid 821 form the center of the lid 821. The multiple ports 825 serve a dual function, reducing stress on an associated sensor while permitting sensed air or environmental materials to pass through the lid 821.

An embodiment device includes a body structure having an interior cavity, a control chip disposed on a first interior surface of the interior cavity, and a sensor attached, at a first side, to a second interior surface of the interior cavity opposite the first interior surface. The sensor has a mounting pad on a second side of the sensor that faces the first interior surface, and the sensor is vertically spaced apart from the control chip by an air gap, with the sensor is aligned at least partially over the control chip. The device further includes an interconnect having a first end mounted on the mounting pad, the interconnect extending through the interior cavity toward the first interior surface, and the control chip is in electrical communication with the sensor by way of the interconnect.

In some embodiments, the body structure includes a sidewall, a lid and a substrate, where a surface of the substrate is the first interior surface, where a surface of the lid is the second interior surface, and where the lid is attached to the substrate by the sidewall. In some embodiments, the lid is formed from a first conductive material, the sidewall comprises a second conductive material, and the lid and the sidewall provide electromagnetic interference (EMI) shielding for the control chip and the sensor. In some embodiments, the body structure includes a lid and a substrate, a first surface of the substrate is the first interior surface, a second surface of the lid is the second interior surface, the lid has side portions that extend past the sensor and bound the interior cavity, and the lid is attached to the substrate at ends of the side portions. In some embodiments, the interconnect is a wirebond interconnect, and the first end of the interconnect is a ball end.

An embodiment device includes a substrate having a first contact pad, a sidewall, and a lid attached to the substrate by the sidewall, where the lid is separated from the substrate by an interior cavity that is bounded by the sidewall, the lid and the substrate. The device further includes a control chip disposed on the substrate and extending from the substrate into the interior cavity, with the control chip in electrical communication with the first contact pad. A sensor is attached, at a first side, to the lid, with the sensor extending from the lid into the interior cavity, and with the sensor having a mounting pad. The sensor is vertically spaced apart from the control chip by an air gap, and wherein the sensor is aligned at least partially over the control chip. The device further has an interconnect having a first end mounted on the mounting pad, with the interconnect extending through the interior cavity and making electrical contact, at a second end of the interconnect opposite the first end, with the first contact pad, where the interconnect is spaced apart from the sidewall.

In some embodiments, the interconnect is a wirebond interconnect, and the first end of the interconnect is a ball end. In some embodiments, the lid is formed from a conductive material. In some embodiments, the sidewall comprises a conductive material and provides electromagnetic interference (EMI) shielding for the control chip and the sensor. In some embodiments, the sidewall is a side portion of the lid. In some embodiments, the lid has a port disposed therein, and the sensor covers the port. In some embodiments, the lid has a port disposed therein, and the sensor is laterally spaced apart from the port. In some embodiments, the sensor is a microelectrical mechanical system (MEMS) microphone. In some embodiments, the sensor has lateral extents that extend past lateral extents of the control chip.

An embodiment method includes attaching a first side of a sensor to a first side of a lid, with the sensor having a contact pad disposed on a second side of the sensor opposite the first side, providing an interconnect on the contact pad, where a first end of the interconnect is attached to the contact pad, and wherein the interconnect extends away from the contact pad, attaching a control chip to a first side of a substrate and electrically connecting the control chip to a landing pad disposed at the first side of the substrate, and affixing the lid over the substrate, wherein the affixing forms an interior cavity between the lid and the substrate. After the affixing, the sensor and the control chip each extend into the interior cavity and an air gap is provided between the sensor and the control chip, and, after the affixing, the interconnect extends through the interior cavity, and a second end of the interconnect makes electrical contact with the landing pad.

In some embodiments, after the affixing, the sensor is at least partly laterally aligned over the control chip. In some embodiments, the providing the interconnect comprises forming a wirebond interconnect with the first end of the interconnect as a ball end. In some embodiments, the method further includes forming a sidewall on the substrate with a first end of the sidewall affixed to the substrate, where the sidewall is conductive, where the lid is formed from a conductive material, wherein the affixing the lid over the substrate comprises affixing the lid to a second end of the sidewall, and, after the affixing, the lid and sidewall provide electromagnetic interference (EMI) shielding for the control chip and the sensor. In some embodiments, the lid includes a side portion extending past the sensor, and where the affixing the lid over the substrate comprises affixing the side portion of the lid to the substrate. In some embodiments, the lid is a center lid disposed on a second package portion having a back volume for the sensor, the center lid has a port extending from the back volume through the center lid, the substrate is part of a first package portion having first sidewalls disposed on the substrate, the affixing the lid over the substrate includes affixing the second package portion to ends of the sidewalls of the first package portion, and the affixing forms the interior cavity as a front volume for the sensor.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A device, comprising:
 a body structure having an interior cavity;
 a control chip disposed on a first interior surface of the interior cavity;
 a landing pad disposed on the first interior surface and electrically connected to the control chip;
 a sensor attached, at a first side, to a second interior surface of the interior cavity opposite the first interior surface, the sensor having a mounting pad on a second side of the sensor that faces the first interior surface, wherein the sensor is vertically spaced apart from the control chip by an air gap, and wherein the sensor is aligned at least partially over the control chip, wherein at least a first portion of the landing pad is aligned directly under the sensor; and
 an interconnect having a first end mounted on, and in direct contact with, the mounting pad, the interconnect extending substantially vertically, with respect to the sensor, through the interior cavity toward the first interior surface, wherein all side surfaces of the interconnect are spaced apart from the interior surfaces of the interior cavity, wherein the side surfaces of the interconnect extend contiguously from the first end of the interconnect to a second end of the interconnect and are exposed to the interior cavity, and wherein the second end of the interconnect is connected to the first portion of the landing pad by a conductive connector in direct contact with the landing pad and the second end of the interconnect;
 wherein the control chip is in electrical communication with the sensor by way of the interconnect and landing pad.

2. The device of claim 1, wherein the body structure includes a sidewall, a lid and a substrate, wherein a surface of the substrate is the first interior surface, wherein a surface of the lid is the second interior surface, and wherein the lid is attached to the substrate by the sidewall.

3. The device of claim 2, wherein the lid is formed from a first conductive material, wherein the sidewall comprises a second conductive material, and wherein the lid and the sidewall provide electromagnetic interference (EMI) shielding for the control chip and the sensor.

4. The device of claim 1, wherein the body structure includes a lid and a substrate, wherein a first surface of the substrate is the first interior surface, wherein a second surface of the lid is the second interior surface, and wherein the lid has side portions that extend past the sensor and bound the interior cavity, and wherein the lid is attached to the substrate at ends of the side portions.

5. The device of claim 1, wherein the interconnect is a wirebond interconnect, and wherein the first end of the interconnect is a ball end.

6. A device, comprising:
 a substrate having a first contact pad;
 a sidewall;
 a lid attached to the substrate by the sidewall, wherein the lid is separated from the substrate by an interior cavity that is bounded by the sidewall, the lid and the substrate;
 a control chip disposed on the substrate and extending from the substrate into the interior cavity, the control chip in electrical communication with the first contact pad;
 a landing pad disposed on the substrate and electrically connected to the control chip;
 a sensor attached, at a first side, to the lid, the sensor extending from the lid into the interior cavity, the sensor having a mounting pad, wherein the sensor is vertically spaced apart from the control chip by an air gap, and wherein the sensor is aligned at least partially over the control chip, and wherein at least a first portion of the landing pad is aligned directly under the sensor; and
 an interconnect having a first end mounted on, and in direct contact with, the mounting pad, the interconnect extending substantially vertically, with respect to the sensor, through the interior cavity and making electrical contact, at a second end of the interconnect opposite the first end, with the first contact pad, wherein the interconnect is spaced apart from side surfaces of the interior cavity, wherein side surfaces of the interconnect extend contiguously from the first end of the interconnect to a second end of the interconnect and are exposed to the interior cavity, and wherein the second end of the interconnect is connected to the first portion of the landing pad by a conductive connector in direct contact with the landing pad and the second end of the interconnect.

7. The device of claim 6, wherein the interconnect is a wirebond interconnect, and wherein the first end of the interconnect is a ball end.

8. The device of claim 6, wherein the lid is formed from a conductive material.

9. The device of claim 6, wherein sidewall comprises a conductive material and provides electromagnetic interference (EMI) shielding for the control chip and the sensor.

10. The device of claim 6, wherein the sidewall is a side portion of the lid.

11. The device of claim 6, wherein the lid has a port disposed therein, and wherein the sensor covers the port.

12. The device of claim 6, wherein the lid has a port disposed therein, and wherein the sensor is laterally spaced apart from the port.

13. The device of claim 6, wherein the sensor is a microelectrical mechanical system (MEMS) microphone.

14. The device of claim 6, wherein the sensor has lateral extents that extend past lateral extents of the control chip.

15. A device, comprising:
 a substrate;
 a lid affixed over the substrate and forming an interior cavity between the lid and the substrate;
 a sensor attached, at a first side, to a first side of the lid, the sensor having a contact pad disposed on a second side of the sensor opposite the first side;
 an interconnect disposed on the contact pad, wherein a first end of the interconnect is directly attached to the contact pad, wherein the interconnect extends away from the contact pad through the interior cavity and extends substantially vertically, with respect to the sensor, to a landing pad disposed at a first side of the substrate, wherein at least a first portion of the landing pad is aligned directly under the sensor, wherein all side surfaces of the interconnect are spaced apart from interior surfaces of the interior cavity, wherein the side surfaces of the interconnect extend contiguously from the first end of the interconnect to a second end of the interconnect and are exposed to the interior cavity, and wherein the second end of the interconnect makes electrical contact with the first portion of the landing pad and is connected to the landing pad by a conductive connector in direct contact with the landing pad and the second end of the interconnect; and a control chip attached to the first side of the substrate and electrically connected to the landing pad;

wherein the sensor and the control chip each extend into the interior cavity; and wherein an air gap is disposed between the sensor and the control chip.

16. The device of claim 15, wherein the sensor is at least partly laterally aligned over the control chip.

17. The device of claim 15, wherein the interconnect is a wirebond interconnect, and wherein the first end of the interconnect is a ball end.

18. The device of claim 15, further comprising a sidewall disposed on the substrate with a first end of the sidewall affixed to the substrate, wherein the sidewall is conductive, and wherein the lid comprises a conductive material.

19. The device of claim 18, wherein the sidewall is a side portion of the lid.

20. The device of claim 15, wherein the lid has at least one port.

* * * * *